United States Patent
Kim et al.

(10) Patent No.: US 9,595,673 B2
(45) Date of Patent: Mar. 14, 2017

(54) METHOD FOR REMOVING ELECTRO-STATIC DISCHARGE (EDS) NOISE SIGNAL IN ELECTRONIC SYSTEM INCLUDING THE METAL-INSULATOR TRANSITION (MIT) 3-TERMINAL DEVICE

(71) Applicant: Electronics and Telecommunications Research Institute, Daejeon (KR)

(72) Inventors: Hyun-Tak Kim, Daejeon (KR); Bongjun Kim, Daejeon (KR); Jeong Yong Choi, Daejeon (KR); Jong Chan Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 398 days.

(21) Appl. No.: 14/355,384

(22) PCT Filed: Oct. 26, 2012

(86) PCT No.: PCT/KR2012/008886
§ 371 (c)(1),
(2) Date: Apr. 30, 2014

(87) PCT Pub. No.: WO2013/066006
PCT Pub. Date: May 10, 2013

(65) Prior Publication Data
US 2014/0285933 A1    Sep. 25, 2014

(30) Foreign Application Priority Data

Oct. 31, 2011 (KR) .......................... 10-2011-0112087
Jul. 4, 2012 (KR) .......................... 10-2012-0073002

(51) Int. Cl.
*H02H 9/00* (2006.01)
*H01L 49/00* (2006.01)

(52) U.S. Cl.
CPC .................................. *H01L 49/003* (2013.01)

(58) Field of Classification Search
CPC .............................. H02H 9/04; H01L 49/003
(Continued)

(56) References Cited

U.S. PATENT DOCUMENTS 5,276,582 A    1/1994    Merrill et al.
6,624,463 B2   9/2003    Kim et al.
(Continued)

FOREIGN PATENT DOCUMENTS

KR    2003-0024156 A    3/2003
KR    2007-0014928 A    2/2007
(Continued)

OTHER PUBLICATIONS

C. Zhou, et al., "A Field Effect Transistor Based on the Mott Transition in a Molecular Layer", Applied Physics Letters, vol. 70, No. 5, pp. 598-600, Feb. 3, 1997.
(Continued)

*Primary Examiner* — Thienvu Tran
*Assistant Examiner* — Lucy Thomas
(74) *Attorney, Agent, or Firm* — Rabin & Berdo, P.C.

(57) ABSTRACT

The inventive concept shows the embodiment of t-switch which is a MIT 3-terminal device based on a Hole-driven MIT theory and a technology for removing an ESD noise signal which is one of applications of the t-switch. The t-switch includes three terminals of Inlet, Outlet and Control, and a metal-insulator transition (MIT) occurs at an Outlet layer by a current flowing through the Control terminal. In the t-switch, a high resistor is connected to the Control terminal and thereby an ESD noise signal of high
(Continued)

voltage flows through the Inlet-Outlet without damaging the device.

17 Claims, 17 Drawing Sheets

(58) Field of Classification Search
USPC .......................................................... 361/56
See application file for complete search history.

(56) References Cited

U.S. PATENT DOCUMENTS

| | | | |
|---|---|---|---|
| 7,291,888 B2 | 11/2007 | Huang | |
| 7,408,217 B2* | 8/2008 | Yoon | H01L 49/003 257/192 |
| 8,330,135 B2 | 12/2012 | Choi et al. | |
| 2009/0230940 A1* | 9/2009 | Lim | H01L 27/0676 323/304 |
| 2010/0301300 A1* | 12/2010 | Kim | H01L 49/003 257/2 |
| 2012/0113706 A1* | 5/2012 | Williams | G11C 13/0007 365/148 |
| 2013/0314825 A1* | 11/2013 | Bajaj | H02H 9/046 361/56 |

FOREIGN PATENT DOCUMENTS

| | | |
|---|---|---|
| KR | 10-0701159 B1 | 3/2007 |
| KR | 10-0714115 B1 | 5/2007 |
| KR | 10-0859717 B1 | 9/2008 |
| KR | 2009-0013657 A | 2/2009 |
| KR | 2010-0033906 A | 3/2010 |
| WO | WO-2007/013724 A1 | 2/2007 |
| WO | WO-2009/027826 A2 | 3/2009 |

OTHER PUBLICATIONS

Hyun-Tak Kim, "Extended Brinkman-Rice Picture and Its Application to High-$T_c$ Superconductors", ARXIV:COND-MAT/0110112 V2, pp. 1-17, Apr. 22, 2002.
Bong-Jun Kim, et al., "$VO_2$ Thin-Film Varistor Based on Metal-Insulator Transition", IEEE Electron Device Letters, vol. 31, No. 1, pp. 14-16, Jan. 2010.
N. F. Mott, "Metal-Insulator Transitions", Taylor & Francis, 1990.
Hyun-Tak Kim, et al., "Mechanism and Observation of Mott Transition in $VO_2$-Based Two- and Three-Terminal Devices", New Journal of Physics, vol. 6 No. 52, pp. 1-19, May 2004.
Hyun-Tak Kim, et al., "Hole-Driven MIT Theory, Mott Transition in $VO_2$, MoBRiK Device", Physica C, vol. 460-462, pp. 1076-1078, Apr. 2007.
Hyun-Tak Kim, "Extension of the Brinkman-Rice Picture and the Mott Transition", Physica C, vol. 341-348, pp. 259-260. 2000.

* cited by examiner

Fig. 10B

| $R_c$, Control Resistor | Current |
|---|---|
| k$\Omega$ | $\mu$A |
| 1 | 36900 |
| 10 | 4270 |
| 50 | 623 |
| 100 | 268 |
| 200 | 120 |
| 300 | 76 |
| 400 | 55 |
| 500 | 43 |
| 600 | 36 |
| 700 | 30 |
| 800 | 26 |
| 900 | 23 |
| 1000 | 21 |
| Open | 0.1(No Current) |

METHOD FOR REMOVING ELECTRO-STATIC DISCHARGE (EDS) NOISE SIGNAL IN ELECTRONIC SYSTEM INCLUDING THE METAL-INSULATOR TRANSITION (MIT) 3-TERMINAL DEVICE

TECHNICAL FIELD

The present inventive concept herein relates to a method for effectively removing electro-static discharge (ESD) that can flow in an electronic system using a metal-insulator transition (MIT) 3-terminal device.

BACKGROUND ART

If an electro-static discharge (ESD) noise signal flows in an electronic system (4) at high speed, weak parts among the system parts are damaged. Thus, a technology for removing an ESD noise signal has been newly developed. An ESD noise signal has a great power (W/Dt). Herein, W is work in physics and Dt is time duration for work. As shown in FIG. 1A, W is great and Dt is small.

FIG. 1A shows a characteristic curve of noise signal in a graph of time relative to current (or voltage). A horizontal axis represents a time and a vertical axis represents a current (or voltage). In FIG. 1A, a voltage of ESD noise signal at time a is much higher than an ESD noise signal at time b or c. To effectively removing an ESD noise signal at time a is crucial.

FIG. 1B illustrates an ESD application system to which an MIT device is applied. Since an ESD noise signal generated in a power line (PL) supplying a power supply (2) can be removed by a MIT device (3) positioned between a node NO1 and a ground, internal parts of electronic system (4) can be protected from ESD.

A noise removing device for removing an ESD noise signal has to have a small standby current and has to have high reliability to effectively remove a high speed voltage ESD noise signal.

DETAILED DESCRIPTION

Technical Problem

Embodiments of the inventive concept provide a metal-insulator transition 3-terminal switch device.

Technical Solution

Embodiments of the inventive concept provide a metal-insulator transition 3-terminal switch device. The metal-insulator transition 3-terminal switch device may include a first conductivity type first semiconductor region that functions as an Outlet region; a second conductivity type second semiconductor region functioning as a control region controlling a discontinuous metal-insulator transition occurring at an interface contacting the first conductivity type first semiconductor region, the second conductivity type second semiconductor region being formed to have a Mott critical concentration $n_c$ on the first conductivity type first semiconductor region; and a first conductivity type third semiconductor region functioning as an Inlet region, the first conductivity type third semiconductor region being disposed on the second conductivity type second semiconductor region.

Embodiments of the inventive concept also provide a metal-insulator transition 3-terminal multi switch device. The metal-insulator transition 3-terminal multi switch device may have a metal-insulator transition 3-terminal switch device in a matrix form of M×N (each of M and N is a natural number of 1 or more) which comprises a first conductivity type first semiconductor region that functions as an Outlet region; a second conductivity type second semiconductor region functioning as a control region controlling a discontinuous metal-insulator transition occurring at an interface contacting the first conductivity type first semiconductor region, the second conductivity type second semiconductor region being formed to have a Mott critical concentration $n_c$ on the first conductivity type first semiconductor region; and a first conductivity type third semiconductor region functioning as an Inlet region, the first conductivity type third semiconductor region being disposed on the second conductivity type second semiconductor region.

Embodiments of the inventive concept also provide a metal-insulator transition 3-terminal multi-switch device package. The metal-insulator transition 3-terminal multi-switch device package may have a metal-insulator transition 3-terminal switch device in a matrix form of M×N (each of M and N is a natural number of 1 or more) which comprises a first conductivity type first semiconductor region that functions as an Outlet region; a second conductivity type second semiconductor region functioning as a control region controlling a discontinuous metal-insulator transition occurring at an interface contacting the first conductivity type first semiconductor region, the second conductivity type second semiconductor region being formed to have a Mott critical concentration $n_c$ on the first conductivity type first semiconductor region; and a first conductivity type third semiconductor region functioning as an Inlet region, the first conductivity type third semiconductor region being disposed on the second conductivity type second semiconductor region, and the metal-insulator transition 3-terminal multi-switch device being packaged with a passivation film at a state that external terminals are exposed so as to apply the metal-insulator transition 3-terminal switch device to an electronic system.

Embodiments of the inventive concept also provide an electrical and electronic system. The electrical and electronic system may include an electrical and electronic circuit; and a metal-insulator transition 3-terminal switch device which is connected between a power line and a ground line of the electrical and electronic circuit, has three terminals of outlet, control and inlet, and is configured so that a discontinuous metal insulator transition occurs at an interface between an inlet region and an outlet region to remove an electro-static discharge noise signal.

Embodiments of the inventive concept also provide a method of removing an ESD noise signal that can inflow through a power line in an electrical and electronic system having an electrical and electronic circuit. The method may include preparing a metal-insulator transition 3-terminal switch device which has three terminals of outlet, control and inlet, and is configured so that a discontinuous metal insulator transition occurs at an interface between an inlet region and an outlet region to remove an electro-static discharge noise signal; and connecting the inlet terminal to the power line, connecting the outlet terminal to a ground line of the electrical and electronic circuit and connecting the control terminal to the power line through a resistor.

Advantageous Effects

According to a method for removing an electro-static discharge (ESD) noise signal in an electronic system including a metal-insulator transistor (MIT) 3-terminal device, an ESD noise signal is effectively removed by a MIT 3-terminal device having relatively small standby current. Thus, a circuit or a part of electronic system is reliably protected from an ESD noise signal.

DESCRIPTION OF DRAWINGS

FIG. 10B is a table illustrating standby current dependence on control resistor in the t-switch of FIG. 7.

BEST MODE FOR INVENTION

Figure 1A:
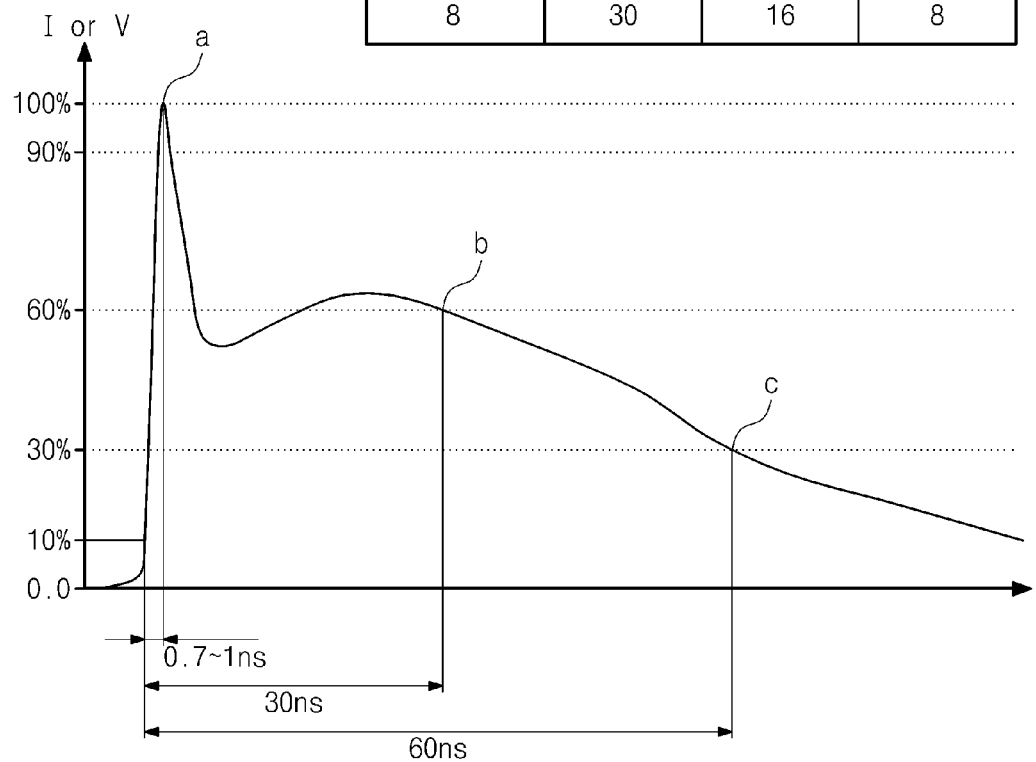
FIG. 1A is a graph showing a characteristic curve of an ESD noise signal.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present.

First, conventional technologies for removing an ESD noise signal are described.

Figure 2:
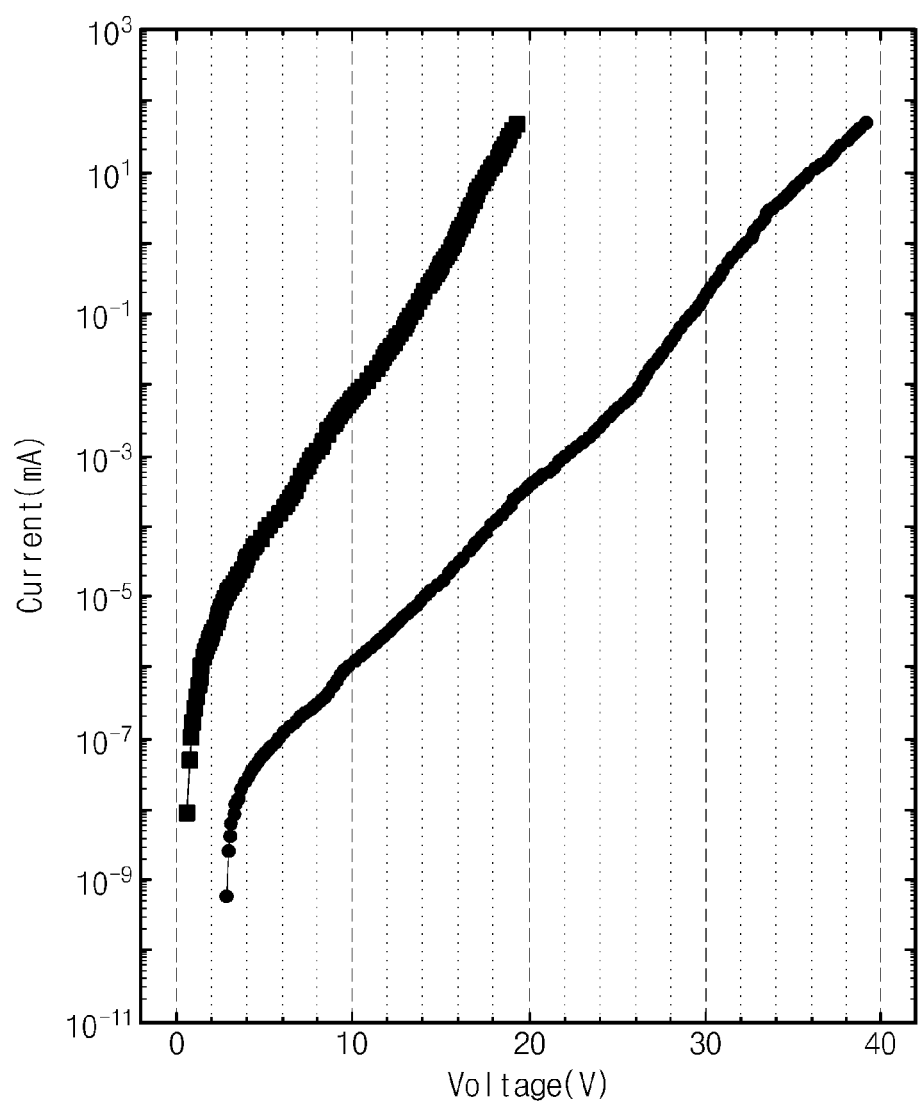
FIG. 2 is a graph showing a current-voltage characteristic curve of varistor.

To remove an ESD noise signal, in early days, an oxide varistor (ZnO) or a zener diode has been used as a noise removal device. A voltage-current characteristic of varistor is shown to be a curve form like FIG. 2. FIG. 2 shows a voltage-current characteristic curve of varistor. A horizontal axis represents a voltage and a vertical axis represents a current. However, if an ESD noise signal repeatedly comes in, a varistor tends to be damaged and thereby reliability of noise removal of varistor is degraded in the long run. Also, a varistor has a disadvantage that a leakage current is very large even at a small voltage.

Figure 3:
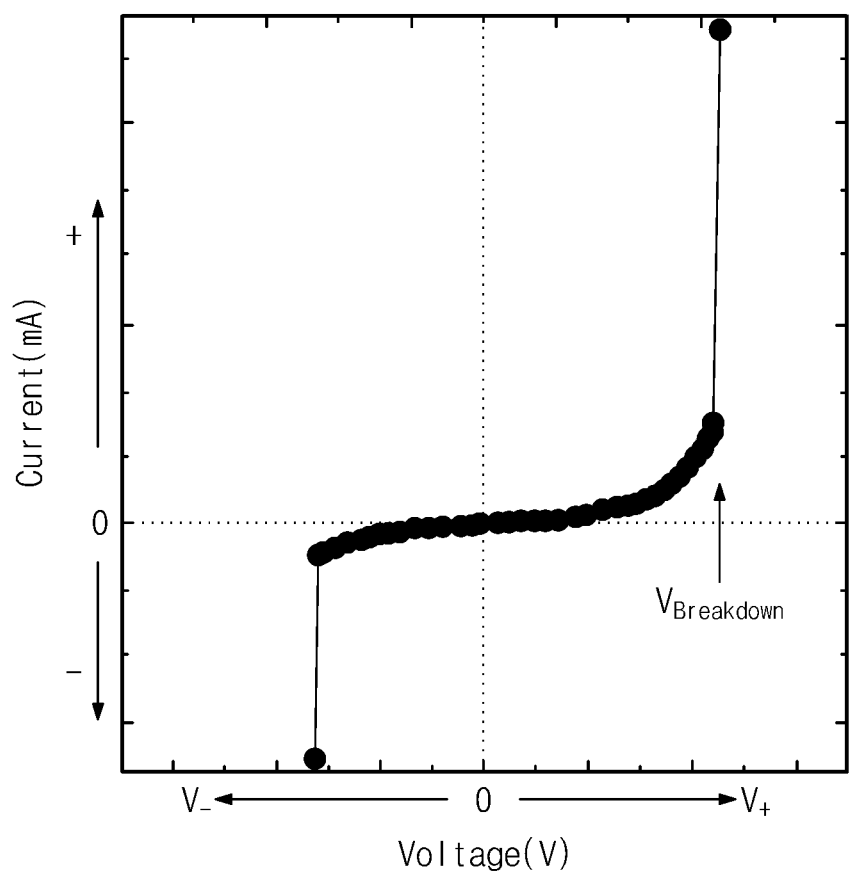
FIG. 3 is a graph showing a current-voltage characteristic curve of zener diode.

As shown in FIG. 3, since a low voltage ESD noise signal can be removed using a breakdown of p-n junction diode, a zener diode has been used to remove an ESD noise signal. FIG. 3 illustrates a current-voltage characteristic curve. A horizontal axis represents a voltage and a vertical axis represents a current.

Referring to FIG. 3, since an ESD noise signal has a great power, if a zener breakdown voltage is great, it is difficult to remove a noise. There is transient voltage suppression (TVS) having a characteristic similar to that of zener diode and it is called an avalanche diode. The avalanche diode is also inadequate to remove a high speed noise signal having a great voltage. A noise removal using a zener diode uses a breakdown characteristic like FIG. 3 and the zener diode is most likely to be damaged when a high speed voltage ESD noise signal comes in. Thus, an avalanche zener diode is also inadequate to remove a high speed voltage ESD noise signal.

Those devices are used to remove a spike voltage to protect a device instead of an ESD noise removal. A spike voltage having about 1 KV or less which is called surge can be removed through a varistor or a zener diode. A varistor and a zener diode are not inadequate as a device to stably and reliably remove an ESD noise signal. This is because a varistor and a zener diode do not have a metal characteristic after a breakdown voltage characteristic.

A metal-insulator transition (MIT) 2-terminal device and a noise removal technology thereof are disclosed in Korean Patent No. 0714115 and a PCT/KR2006/001249. As a conventional technology, a characteristic of 2-terminal MIT device is illustrated in FIG. 4.

Figure 4:
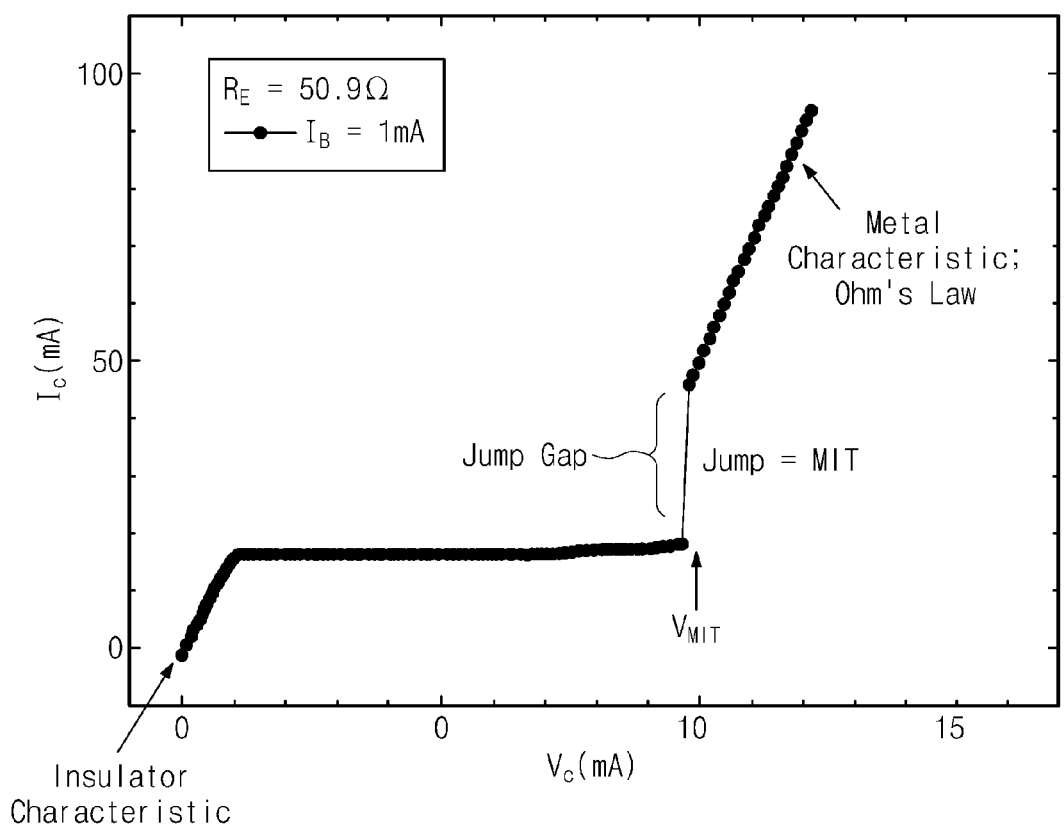
FIG. 4 is a graph showing a characteristic curve of 2-terminal MIT device.

FIG. 4 is a graph showing a characteristic curve of 2-terminal MIT device. A horizontal axis represents a voltage and a vertical axis represents a current.

The study that a standby current has to be great when using a 2-terminal MIT device having the current-voltage characteristic like FIG. 4 as an ESD noise removal device was published in IEEE Electron Device Letters 31 (2010) 14 by the inventors.

Figure 1B:
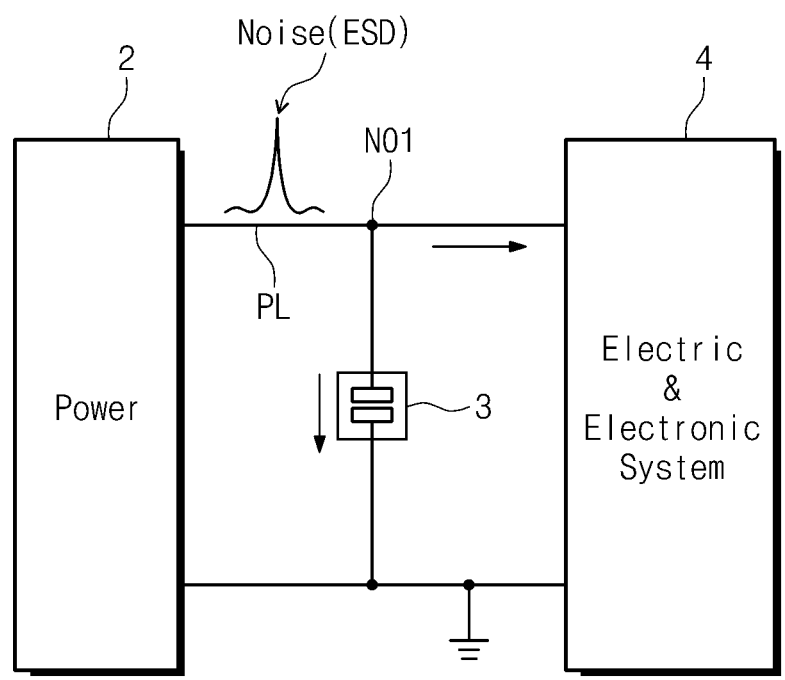
FIG. 1B is a drawing illustrating an ESD application system to which a MIT device is applied.
Figure 5:
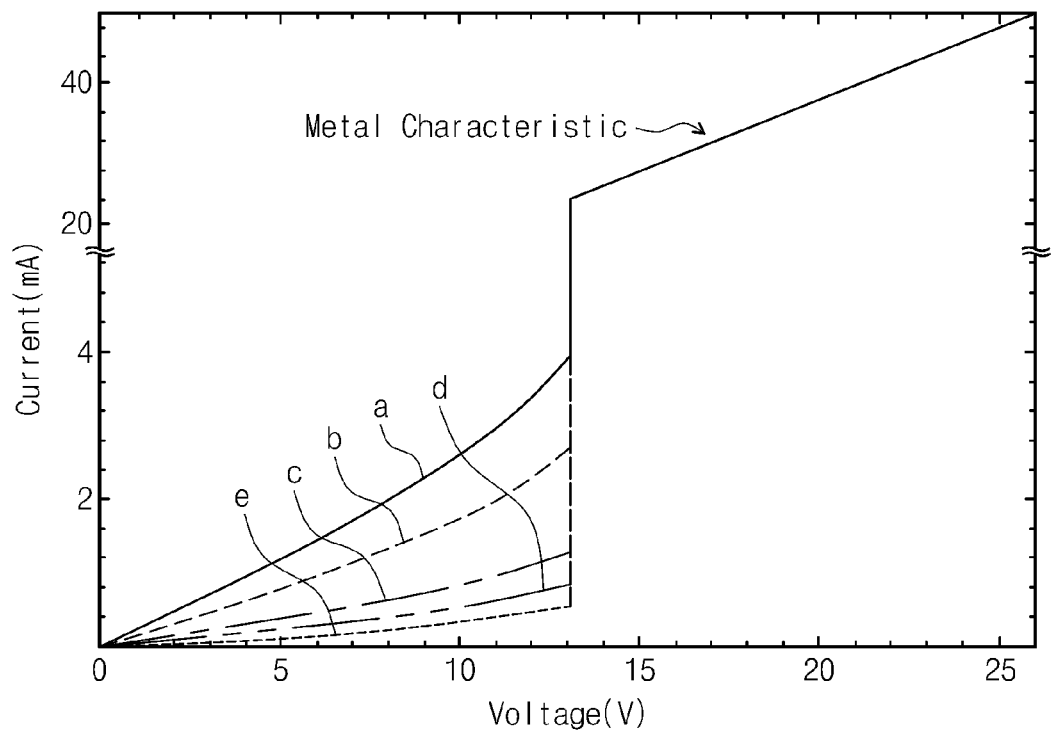
FIG. 5 is a graph showing I-V characteristic curves of various MIT devices.

The study discloses the characteristic illustrated in FIG. 5. FIG. 5 is a graph showing I-V characteristic curves of various MIT devices. A horizontal axis represents a voltage and a horizontal axis represents a current. The data in the graph of FIG. 5 is quoted from FIG. 1 of the IEEE Electron Device Letters 31 (2010) 14.

In FIG. 5, a device having an I-V characteristic of small jump width like the uppermost black line a passes an ESD signal through well but a device having an I-V characteristic of great jump width like the lowermost red line e is easily damaged by an ESD signal. It is a fatal fault to a device that a standby current has to be great. That fault is similar to fault of varistor. A 2-terminal MIT device made of $VO_2$ material has a MIT at 68° C. and thereby it is difficult for the 2-terminal MIT device to be used as an ESD noise removal device above 60° C. The device disclosed in the IEEE Electron Device Letters 31 (2010) 14 has the problem described above.

A bipolar junction transistor was used to remove an ESD noise signal. In this case, in a system for removing ESD, a base of NPN transistor is connected to a zener diode connected to a power line, a collector of NPN transistor is connected to the power line and an emitter of NPN transistor is connected to a ground. At this time, an ESD noise signal passes through from collector to emitter (for example, U.S. Pat. No. 5,276,582). A PNP transistor was used to remove an ESD noise signal in a forward method (emitter→collector) (for example, U.S. Pat. No. 7,291,888 B2).

Embodiment of 3-terminal function using a MIT 2-terminal switch is disclosed in Korean Patent No. 0859717 and PCT WC2009027826-A2. However, since the 3-terminal device using a 2-terminal MIT switch is based on a characteristic of 2-terminal MIT device, reliability thereof may be inadequate.

A device of high reliability is required which has a small standby current and can endure a large ESD noise signal.

A MIT is a discontinuous jump phenomenon as described through FIG. 4. In a MIT device, a metal characteristic satisfying an ohm's law after the MIT appears. When an ESD noise signal having a high voltage comes in at high speed, a MIT device removes an ESD noise signal by making an ESD noise signal flow along a metal.

Figure 7:
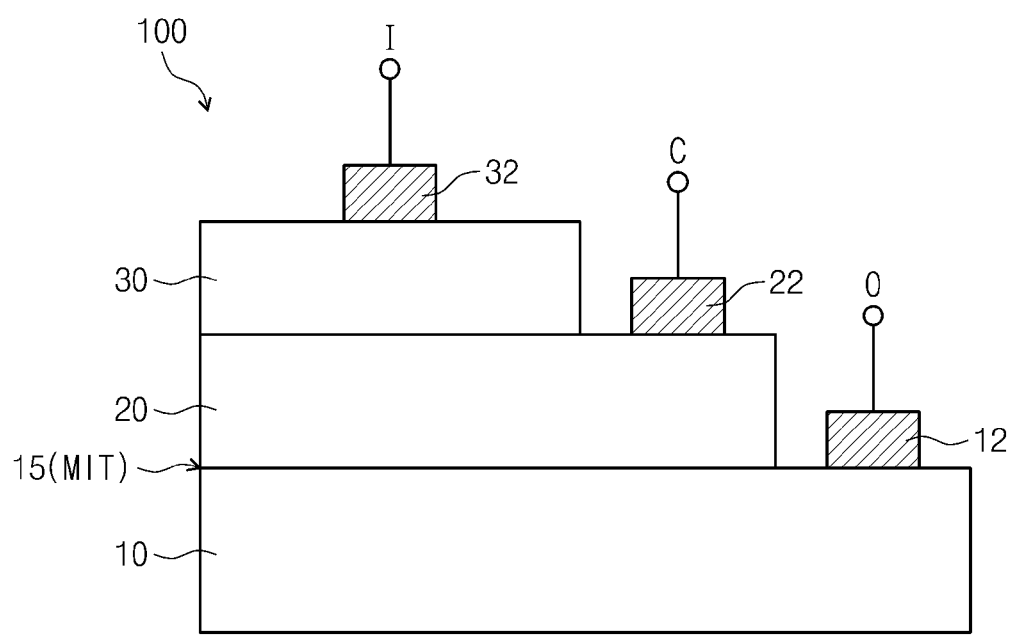
FIG. 7 is a basic structure of a metal-insulator transition (MIT) 3-terminal switch device (t-switch) in accordance with some embodiments of the inventive concept.

To realize a small standby power and high reliability, the inventive concept broke away from a 2-terminal MIT device and created the MIT 3-terminal device illustrated in FIG. 7.

FIG. 7 is a basic structure of a metal-insulator transition (MIT) 3-terminal switch device (t-switch) in accordance with some embodiments of the inventive concept.

Referring to FIG. 7, the t-switch includes a first conductivity type first semiconductor region 10, a second conductivity type second semiconductor region 20 that functions as a control region controlling a discontinuous metal insulator transition occurring at an interface 15 contacting the first conductivity type first semiconductor region 10 and which is formed to have a Mott critical concentration $n_c$ on the first conductivity type first semiconductor region, and a first conductivity type third semiconductor region 30 which is disposed on the second conductivity type second semiconductor region 20 and that functions as an inlet region.

If the first conductivity type is an n-type, the second conductivity type may be a p-type.

Unlike a transistor which is a semiconductor device, the MIT 3-terminal device (t-switch) of FIG. 7 has three terminals 32, 12 and 22 of an inlet I, an outlet O and a control C. If a current flows through the C region 20, a MIT occurs and thereby a current by the MIT flows from the I region 30 to the O region 10 to a metal level characteristic.

Figure 6:
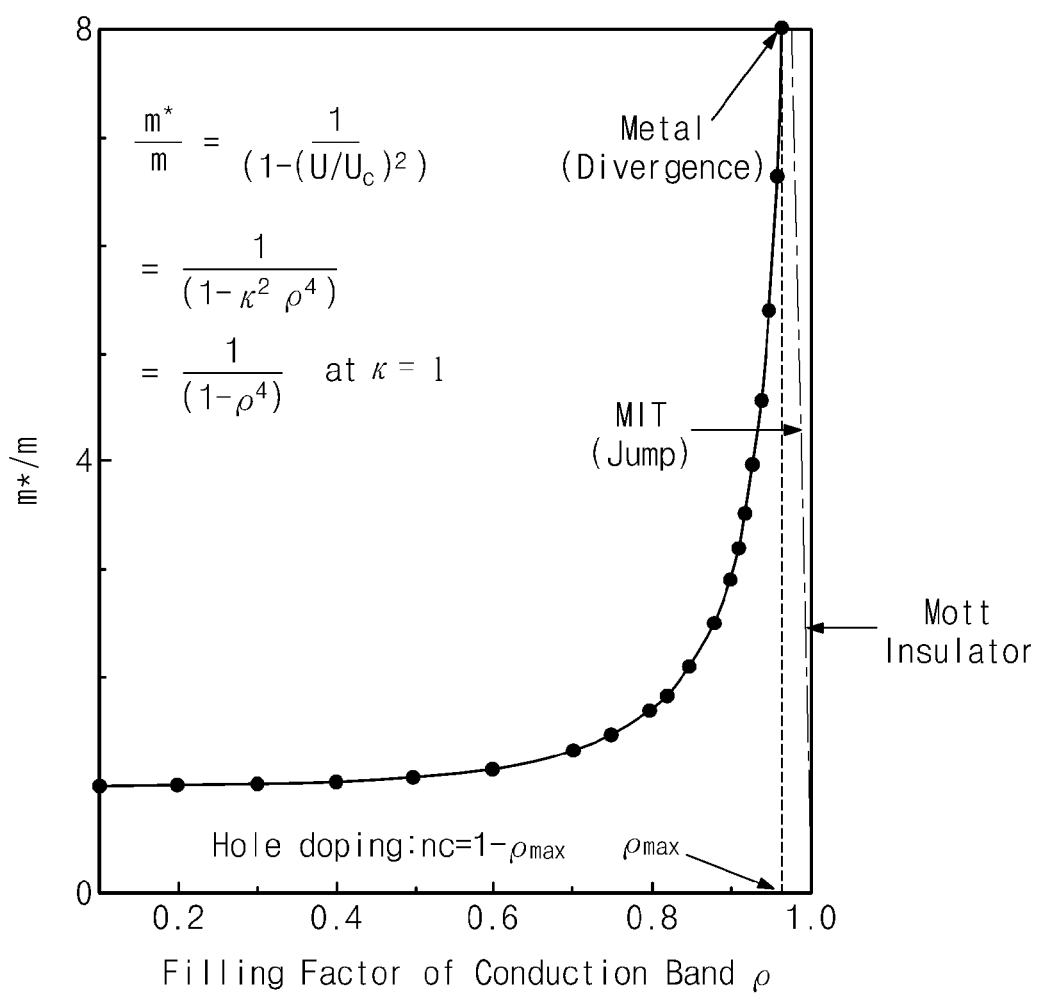
FIG. 6 a graph showing a result of Hole-driven MIT theory.

The t-switch has a discontinuous jump phenomenon when it is turned on and the t-switch is switched from insulator to metal due to a MIT phenomenon. The t-switch of FIG. 7 operates on the basis of a Hole-driven MIT theory (Physica C 460-462 (2007) 1076-1978). The Hole-driven MIT theory (Physica C 341-348 (2000) 259; Physica C 460-462 (2007) 1076-1078) may be described through FIG. 6. FIG. 6 is a graph showing a result of the Hole-driven MIT theory. A horizontal axis represents a filling factor of conduction band and a vertical axis represents electrical conductivity. In the theory, if introducing a hole of small concentration into a Mott insulator having an electronic structure of metal by $n_c$, the Mott insulator discontinuously transits into a strongly correlated type metal. FIG. 6 shows a result of Hole-driven MIT theory.

A carrier of metal in FIG. 6 is an electron. If a carrier is a hole after a MIT occurs, an insulator is a hole-type insulator. In this case, if introducing an electron into the insulator, a MIT occurs due to destruction of coulomb energy from the insulator to the metal. Those are disclosed in the paper of titled "Extended Brinkman-Rice Picture and Its Application to High-Tc Superconductors" submitted on Oct. 5, 2001 by Hyun-Tak Kim.

Referring back to FIG. 7, a basic structure of the t-switch is that an insulator or the semiconductor region 10 of insulator level into which an electron of very low concentration is introduced is connected to one side of the semiconductor region 20 for a signal control into which a hole is doped. The semiconductor region 30 into which an electron of relatively high concentration is doped is connected to the other side of the semiconductor region 20 for a signal control.

Consequently, the first semiconductor region 10 of insulator level is connected to one side of the second semiconductor region 20 and the third semiconductor region 30 of metal level is connected to the other side of the second semiconductor region 20. Herein, the third semiconductor region 30 of metal level corresponds to an inlet region and the first semiconductor region 10 of insulator level corresponds to an outlet region. The second semiconductor region 20 into which a hole is doped corresponds to a control region.

The amount nc of doping of the second semiconductor region 20 in which the control terminal is formed is about $(0.25/a_o)^3$ (Mott N F 1990 Metal-insulator Transition (London: Taylor and Francis)). Herein, $a_o$ means Bohr radius of hydrogen atom. Generally, $n_c \approx 1 \times 10^{18}$ cm$^{-3}$.

The t-switch of FIG. 7 as an embodiment of the inventive concept may be manufactured as follows.

The first semiconductor region 10 may be made of high resistance n-type silicon single crystal wafer having a thickness of 0.3 mm. An electron of low concentration (~1× $10^{15~16}$ cm$^{-3}$) is introduced into the first semiconductor region 10.

A Si thin film into which a hole of Mott reference $n_c \sim 1 \times 10^{18}$ cm$^3$ is introduced may be formed on the first semiconductor region 10 as the second semiconductor region 20. Herein, the second semiconductor region 20 may be deposited to be a thickness of about 100 nm.

The third semiconductor region 30 used as an inlet layer is formed on the second semiconductor region 20. The third semiconductor region 30 may be a Si thin film into which an electron of $1 \times 10^{19}$ cm-3 is introduced. In this case, a thickness of the thin film is about 20 nm and the thin film may be formed by an open deposition method.

The thin film may be etched by an ion sputtering method to be patterned to a specific form. After an electrode formation process and a series of device manufacturing back process are performed, a 3-terminal device having an area of about 400×400 nm may be obtained.

The silicon single crystal wafer may be grinded to a thickness of 150 nm to manufacture an outlet layer that is thinner.

In FIG. 7, each of the first, second and third semiconductor regions 10, 20 and 30 may be one of Si, SiC, GaN, VO$_2$, V$_2$O$_3$ and carbon system material (Graphite, Graphene) into which an electron or a hole is introduced.

Each of the first, second and third semiconductor regions 10, 20 and 30 may be a compound semiconductor made of one of elements of IV group, III-V group and II-VI group or selective combinations thereof.

Figure 8:
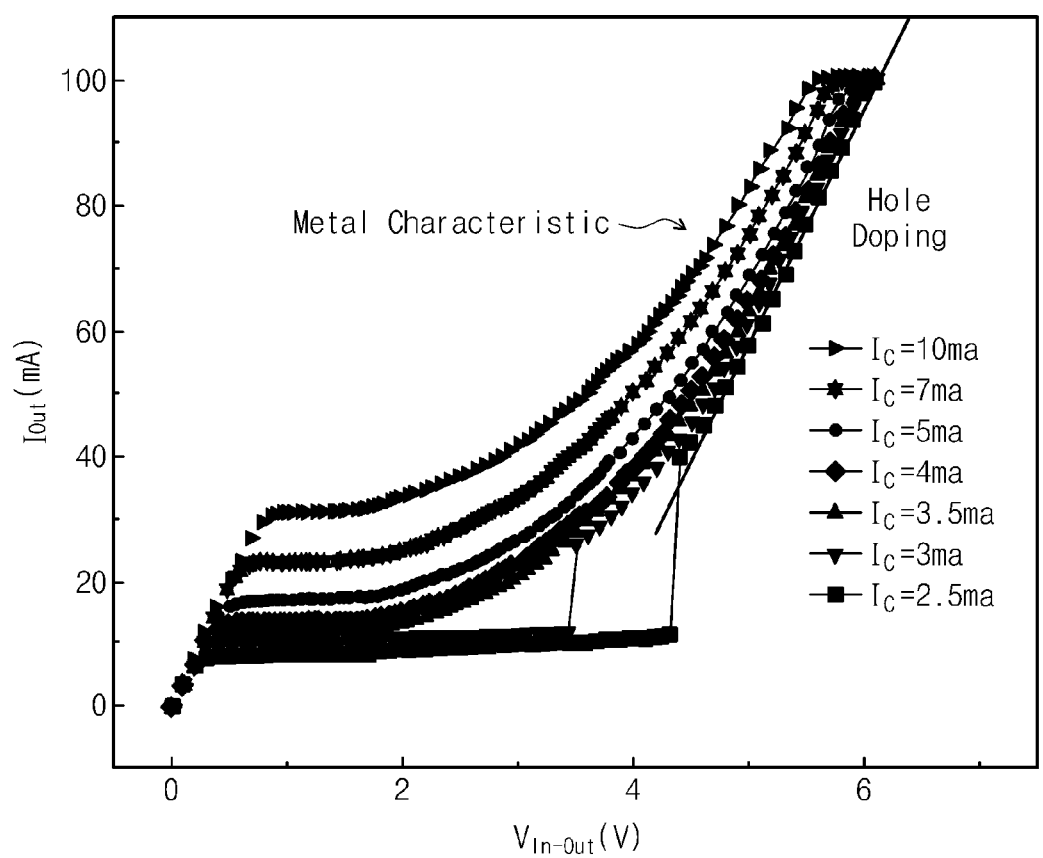
FIG. 8 is a graph showing an I-V characteristic curve of t-switch of FIG. 7.

FIG. 8 is a graph showing an I-V characteristic curve of t-switch of FIG. 7. In FIG. 8, a horizontal axis represents a voltage and a vertical axis represents an output current.

A current $I_{IO}$ flowing from the inlet region 30 to the outlet region 10 is represented while increasing a current of the control region 20. In FIG. 8, when a current does not flow through the control region 20, the current $I_{IO}$ does not flow. This means that a leakage current does not exist. At $V_{in-Out} \equiv V_{MIT} = 4.3V$ and $I_C = 2.5$ mA, a current jump of $I_{oc}$ is represented and at $V_{in-Out} > 4.3V$, a linearity following ohm's law is represented. This means that a MIT occurs at 4.3V. After the jump, a slope (red line) of ohm's law which is a metal characteristic does not coincide with a starting point and thereby it is estimated that the outlet region 10 is non-uniform. As Ic increases, $V_{MIT}$ which is a MIT jump voltage is reduced and the amount of Ijump is reduced, and only ohm's law without jump remains. These are general MIT characteristics. This also means that device is properly manufactured. When viewed from the t-switch device, if a current flows from the C region 20 to the O region 10, a hole in the C region 20 flows in the O region 10, so that a Hole-driven MIT occurs. Thus, a current flows from the I region 30 to the O region 10 to a metal level characteristic. A MIT occurs at an interface between the O region 10 and the C region 20. If a current in the C region 20 increases, hole doping also increases and thereby a MIT occurs at larger area. The amplitude of MIT jump is gradually reduced while a current flows from the I region 30 to the O region 10 to a metal level characteristic. This phenomenon can be explained on the basis of the Hole-driven MIT theory.

Figure 9:
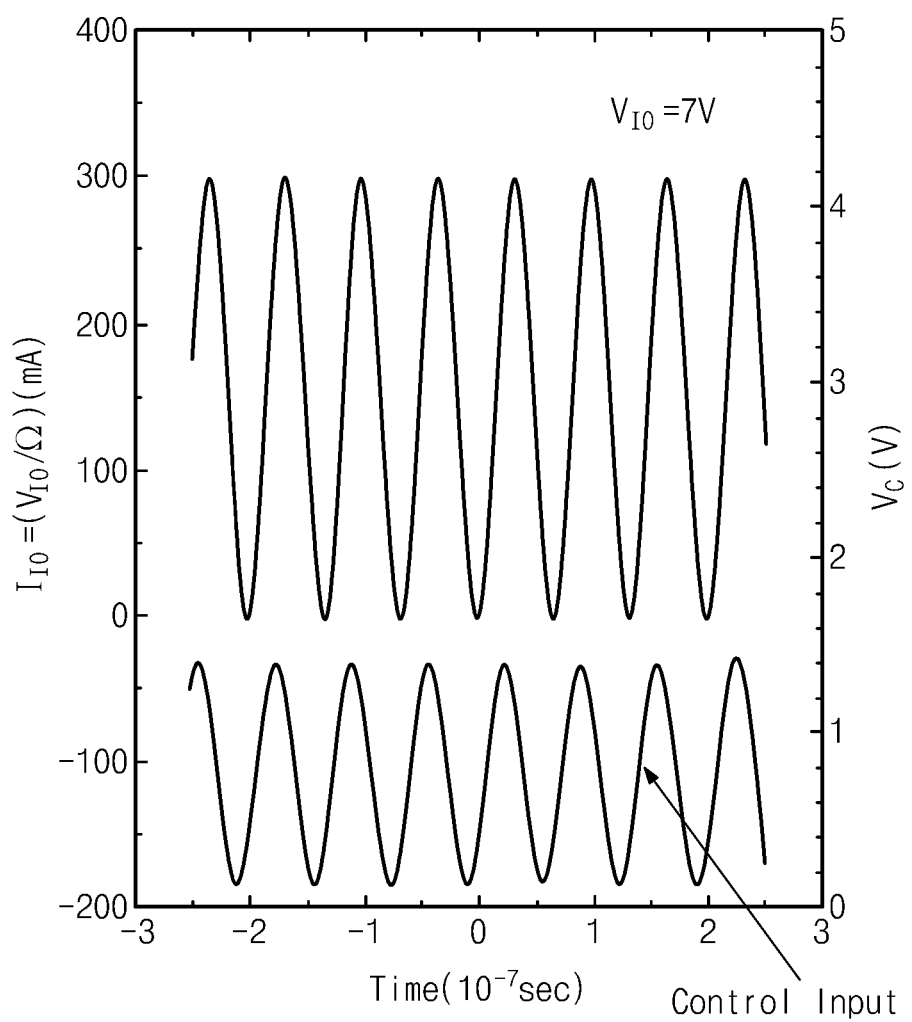
FIG. 9 is a graph showing a switching characteristic curve of t-switch of FIG. 7.

FIG. 9 is a graph showing a switching characteristic curve of t-switch of FIG. 7.

In FIG. 9, a horizontal axis represents a time and a vertical axis represents a current.

In the case that a sine wave signal of $I_{control}$=20 mA of 15 kHz is successively inputted to the control terminal 22 of the t-switch, a MIT switching waveform flowing through $I_{IO}$ at $V_{IO}$ is represented as an output waveform. Herein, a current of about 200 mA flows. An amplification rate is 5 and a thermal runaway appearing in a semiconductor device does not appear. A surface temperature of the t-switch is about 30° C.-40° C. The t-switch manufactured like this has a room for improvement but shows an experiment result which serves invention's purpose. This is first experiment result of MIT switching observed in the world.

A voltage between inlet terminal and outlet terminal of the t-switch is 7V and this voltage is very high as compared with that of transistor.

The t-switch has a disadvantage that it turns on and switches (jump) at a higher voltage $V_{MIT}$ than a transistor and large currents flow through the t-switch to generate Joule heat. The t-switch has an advantage that a thermal runaway phenomenon occurring when a transistor is heated does not occur in the t-switch. In an ESD noise signal, the greater part of high voltage and large current flows during 50 nano second or less. When controlling a control current of the t-switch by a high voltage and large current of ESD, a jump of metal current flowing from the I region 30 to the O region 10 is easily controlled. The t-switch in accordance with the inventive concept can effectively remove an ESD noise signal without consuming standby current. Also, since the t-switch is strong on a thermal runaway, high reliability of device can be obtained.

The t-switch structure and the characteristics of FIGS. 8 and 9 are a switch of new operation that cannot be seen in a general transistor. The t-switch is improved or applied from MoBRiK t-switch. The MoBRiK is an initial letter of physicists developing the MIT theory. The t-switch is discriminated from a Mott transistor showing only a characteristic of semiconductor not having a discontinuous jump developed by IBM or a field-effect MIT 3-terminal device.

The t-switch of FIG. 7 has a similar structure to that of bipolar transistor but has a different operation mechanism from that of bipolar transistor. In case of NPN transistor, a collector corresponds to an Outlet, an emitter corresponds to an Inlet and a base corresponds to a Control and in case of PNP transistor, a collector corresponds to an Inlet, an emitter corresponds to an Outlet and a base corresponds to a Control.

The t-switch of FIG. 7 has a difference in a doping concentration of semiconductor regions connected to the I, O and C terminals as compared with that of bipolar transistor. The bipolar transistor has a different doping concentration from that of the t-switch. In the bipolar transistor, a device breakdown and heating may occur due to non-uniform of doping concentration in Si material. Thus, a device is easily damaged and thereby reliability of the device is degraded. For such reasons, it is estimated that a characteristic of the t-switch is not found in a bipolar transistor.

Another difference is that $V_{IO}$ voltage in FIG. 9 is 7V. A voltage between Inlet terminal and Outlet terminal of the t-switch is 7V while a collector-emitter voltage $V_{CE}$ of transistor is 1V or less.

In the transistor, an input part (a collector in NPN transistor and an emitter in PNP transistor) is lightly doped and an output part (an emitter in NPN transistor and a collector in PNP transistor) is heavily doped, and a tunneling phenomenon is used in a device operation without MIT phenomenon. In the t-switch, an input part is heavily doped and an output part is negligibly lightly doped, and a MIT phenomenon is used in an operation of device. If making the device of FIG. 7 exquisitely, a t-switch having high reliability can be obtained. The I, O and C terminals 32, 12 and 22 may be aluminum material electrodes contacting corresponding semiconductor regions respectively.

A laminated structure of 3-terminal device using the 2-terminal device disclosed by the present inventors is a structure that a MIT thin film is stacked on a lower electrode formed on an insulator substrate structure. This is disclosed in Korean Patent No. 0859717 and a PCT/WC2009027826-A2. The conventional structure has a structure of substrate/a lower electrode thin film (Outlet)/MIT thin film/electrode thin film (Control)/MIT thin film/electrode thin film (Inlet). The distinct feature is that there are two MIT thin films into which a hole having Mott nc concentration is introduced.

The t-switch structure of the inventive concept has a structural feature that a Control layer into which a hole having Mott $n_c$ concentration is introduced is disposed between an Inlet layer and an Outlet layer and a MIT layer in which a MIT occurs when it is turned on is disposed between a Control layer and an Outlet layer. When viewed from a structure, it seems that an additional MIT layer exists between the Control-Inlet having a hole. However, only one MIT layer exists. That is, since the Control layer and the Inlet layer have the amount of doping to some degree, a MIT does not occur at an interface between the Control layer and the Inlet layer. The 3-terminal device of the inventive concept is considered to have one MIT layer. Since the Outlet layer uses a very thin wafer single-crystalline layer which is not a thin film, the device becomes strong and has heat durability. In the device structure of the inventive concept, the Control layer and the Inlet layer are thin films. This is also a difference between the inventive concept and the conventional technology.

Figure 10A:
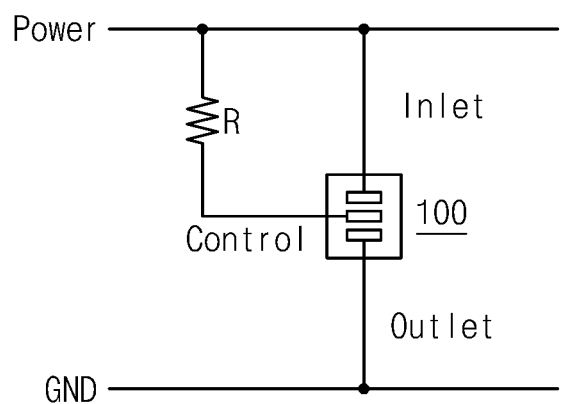
FIG. 10A is a drawing illustrating a case that the t-switch of FIG. 7 is installed in a circuit.

FIG. 10A is a drawing illustrating a case that the t-switch of FIG. 7 is installed in a circuit.

Referring to FIG. 10A, the t-switch 100 which is a MIT 3-terminal switch device is connected between a power line and a ground line. Herein, a Control terminal is connected to the power line through a resistor R.

Like this, when removing an ESD noise signal, a resistor R may be further installed between the Control terminal of the t-switch and the power line. The resistor R may vary with the degree of allowance of standby current and the strength of noise signal.

FIG. 10B is a table illustrating standby current dependence on control resistor in the t-switch of FIG. 7. The table shows standby current dependence on control resistor when 5V is applied between the Inlet and the Outlet.

Figure 11:
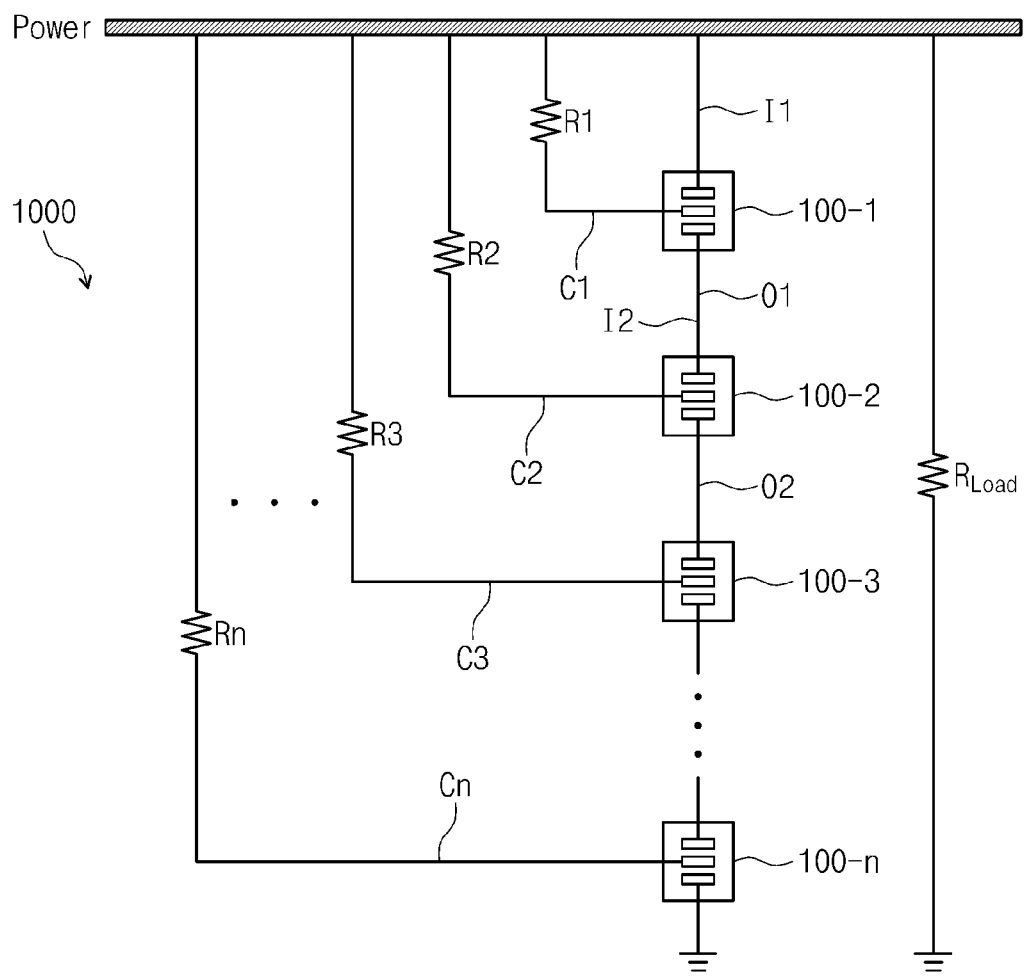
FIG. 11 is a circuit diagram illustrating a case that the t-switch of FIG. 7 is serially connected.

FIG. 11 is a circuit diagram illustrating a case that the t-switch of FIG. 7 is serially connected.

Since a combined resistance increases when connecting the t-switch serially, a standby current tends to be reduced. RLOAD may mean a combined resistance of electronic system to be protected. In FIG. 11, control terminals C1, C2, C3 and Cn of the t-switches 100-1, 100-2, 100-3 and 100-n are connected to the power line through respective resistors R1, R2, R3 and Rn.

Figure 12:
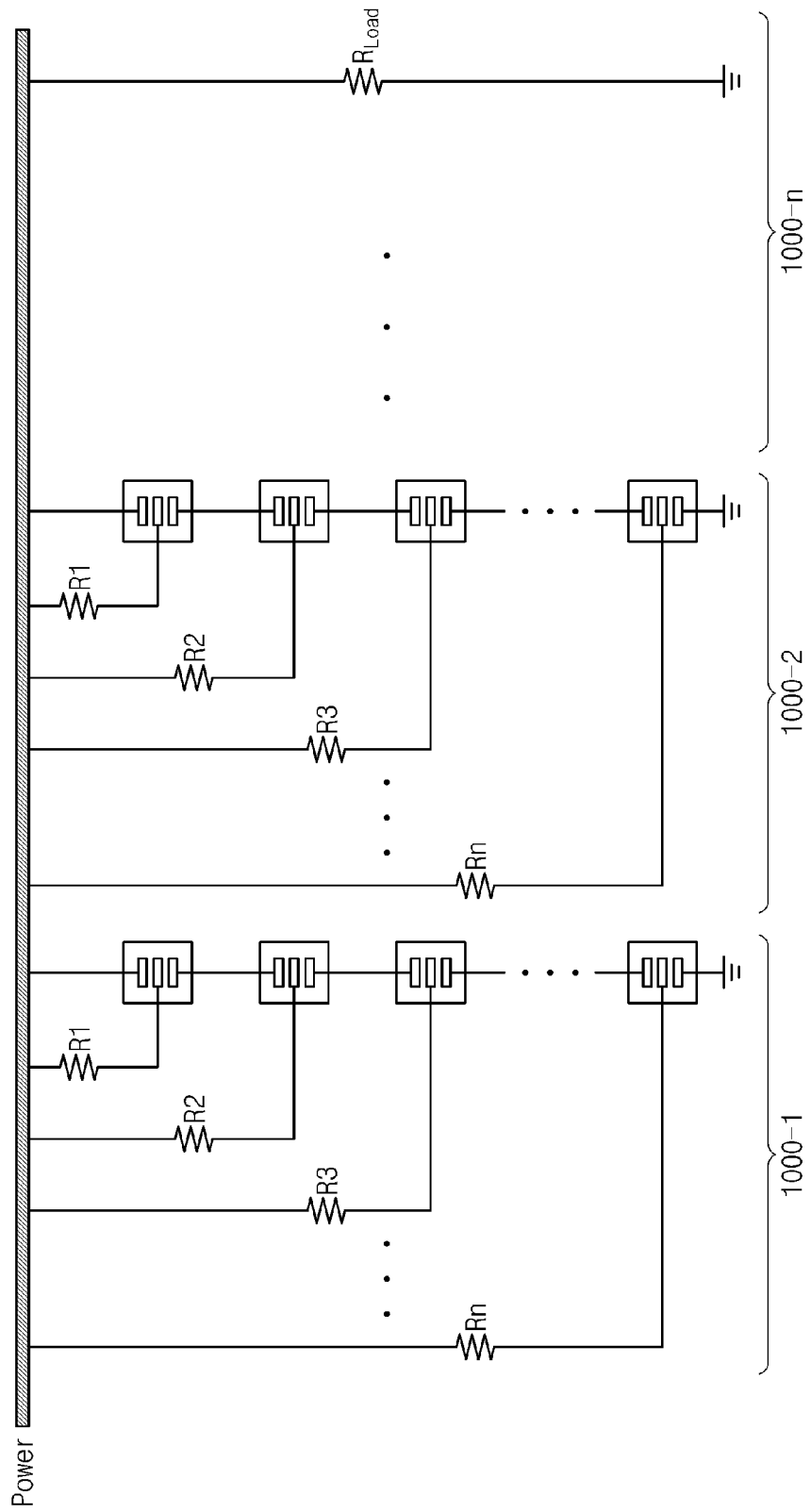
FIG. 12 is a circuit diagram illustrating a case that the t-switch of FIG. 7 is connected in a matrix form.

FIG. 12 is a circuit diagram illustrating a case that the t-switch of FIG. 7 is connected in a matrix form. RLOAD may mean a combined resistance of electronic system to be protected. If the t-switch is connected in a matrix form of M×N (each of M and N is a natural number of 1 or more), the whole combined resistance becomes a resistance of one t-switch. Overall, an ESD of large voltage can be removed by a series connection and an ESD of large current can be removed by a parallel connection. The t-switch connected in series and in parallel may become one package through a protective film or a passivation film like IC.

In FIG. 12, serial group switches 1000-1, 1000-2 and 1000-n correspond to the serial switches of FIG. 11 respectively.

Figure 13A:
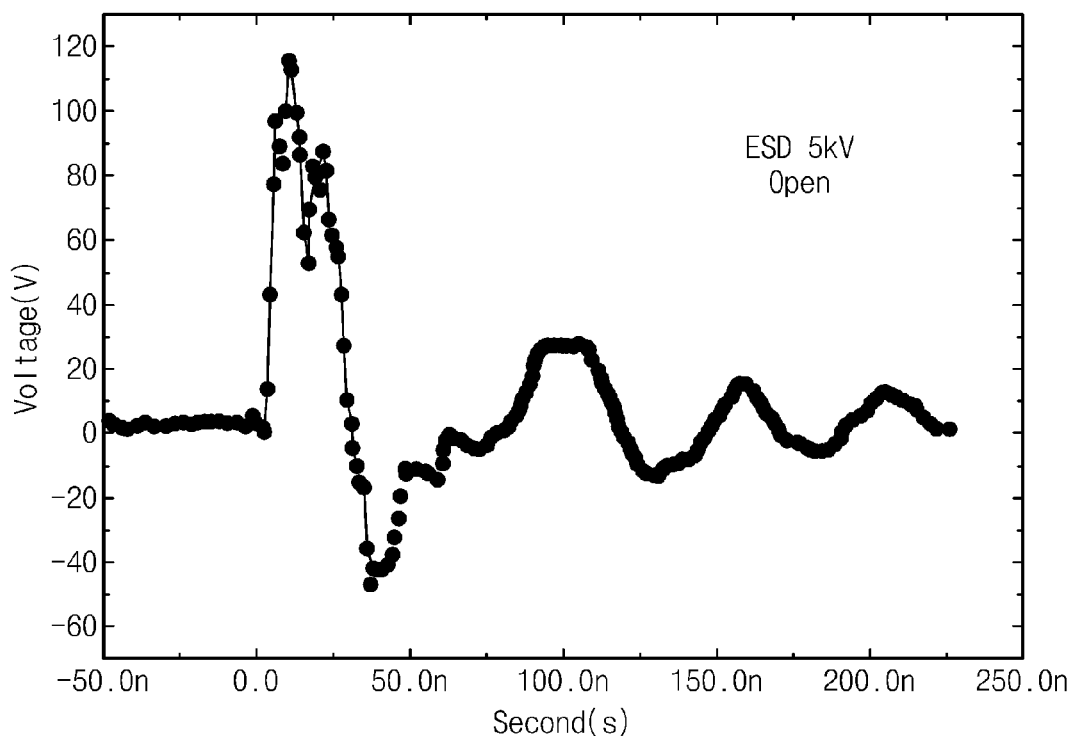
FIGS. 13A through 13C are graphs showing various test results of t-switch of FIG. 7.
Figure 13B:
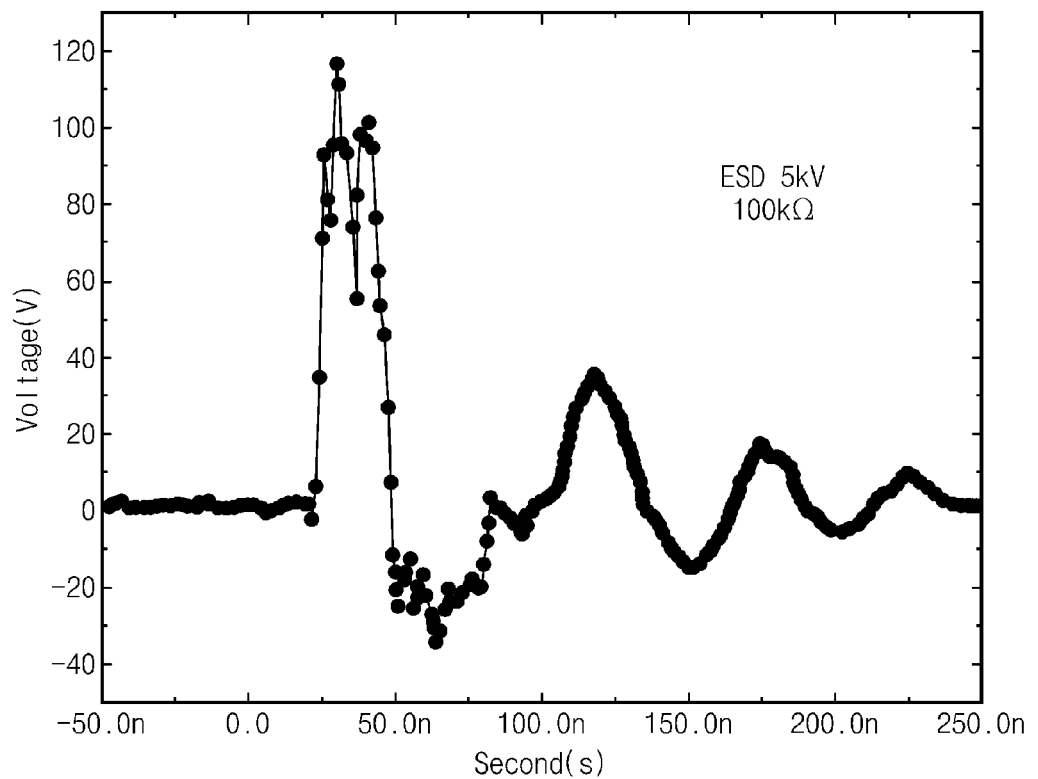
Figure 13C:
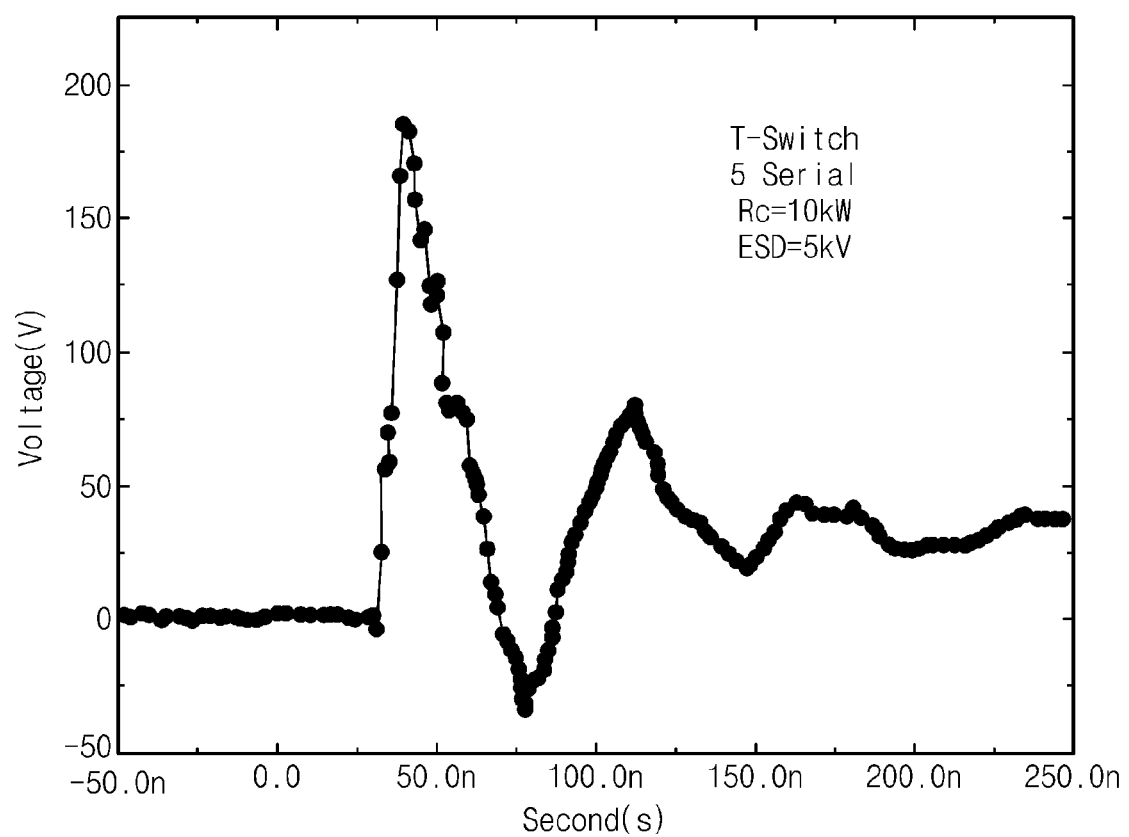

FIGS. 13A through 13C are graphs showing various test results of t-switch of FIG. 7. In FIGS. 13A through 13C, a horizontal axis represents a time and a vertical axis represents a voltage.

FIG. 13A is a test result using a metal characteristic of after jump. FIG. 13A shows a test result measured using an ESD of 5 kv under the condition that the Control terminal is open.

FIG. 13B shows a test result measured using an ESD of 5 kv under the condition that 100 kw is applied to Control terminal. A removal of ESD noise signal is possible depending on a metal characteristic of t-switch.

In FIG. 13C, when 5 t-switches are serially connected, a reduction of standby current is observed and an ESD signal of high voltage is effectively removed. That is, FIG. 13C shows a test result measured using an ESD of 5 kv under the condition that 5 t-switches are serially connected and 10 kw is applied to Control terminal.

Mode for the Invention

According to a method for removing an electro-static discharge (ESD) noise signal in an electronic system including a metal-insulator transistor (MIT) 3-terminal device, an ESD noise signal is effectively removed by a MIT 3-terminal device having relatively small standby current. Thus, a circuit or a part of electronic system is reliably protected from an ESD noise signal.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the present invention. Accordingly, all such modifications are intended to be included within the scope of the present invention as defined in the claims. The present invention is defined by the following claims, with equivalents of the claims to be included therein.

The invention claimed is:

1. A metal-insulator transition 3-terminal switch device comprising:
    a first conductivity type first semiconductor region configured to function as an Outlet region;
    a second conductivity type second semiconductor region functioning as a control region controlling a discontinuous metal-insulator transition occurring at an interface contacting the first conductivity type first semiconductor region, the second conductivity type second semiconductor region being formed to have a Mott critical concentration $n_c$ on the first conductivity type first semiconductor region; and
    a first conductivity type third semiconductor region functioning as an Inlet region, the first conductivity type third semiconductor region being disposed on the second conductivity type second semiconductor region.

2. The metal-insulator transition 3-terminal switch device of claim 1, wherein if the first conductivity type is a p-type, the second conductivity type is an n-type.

3. The metal-insulator transition 3-terminal switch device of claim 1, wherein if the first conductivity type is an n-type, the second conductivity type is a p-type.

4. The metal-insulator transition 3-terminal switch device of claim 1, wherein each of the first, second and third semiconductor regions is one of Si, SiC, GaN, $VO_2$, $V_2O_3$ and carbon system material (Graphite, Graphene) into which an electron or a hole is introduced.

5. The metal-insulator transition 3 terminal switch device in claim 1, wherein each of the first, second and third semiconductor regions is packaged with a passivation film at a state that external terminals are exposed so as to apply the metal-insulator transition 3-terminal switch device to an electronic system.

6. The metal-insulator transition 3-terminal switch device of claim 1, wherein at least one of the first, second and third semiconductor regions is a single crystal substrate.

7. The metal-insulator transition 3-terminal switch device of claim 1, wherein in the event that the first and third semiconductor regions are connected to a power and a ground respectively, the second semiconductor region is connected to the power through a resistor.

8. The metal-insulator transition 3-terminal switch device of claim 1, wherein an electron doping concentration or a hole doping concentration of the second semiconductor region is $1\times10^{18}$ cm$^{-3}$ or more.

9. A metal-insulator transition 3-terminal switch device module, wherein a matrix of M×N of the metal-insulator transition 3-terminal devices of claim 1 (each of M and N is a natural number of 1 or more) is composed.

10. The metal-insulator transition 3-terminal switch device module in claim 9, wherein each of the first, second and third semiconductor regions is packaged with a passivation film at a state that external terminals are exposed so as to apply the metal-insulator transition 3-terminal switch device to an electronic system.

11. An electrical and electronic system comprising:
    an electrical and electronic circuit; and
    a metal-insulator transition 3-terminal switch device which
        is connected between a power line and a ground line of the electrical and electronic circuit,
        has an outlet terminal, a control terminal and an inlet terminal, and
        has a first semiconductor region of a first conductivity type configured to function as an outlet region, a second semiconductor region of a second conductivity type configured to function as a control region, and a third semiconductor region of the first conductivity type that is configured to function as an inlet region, and is disposed on the second semiconductor region, such that a discontinuous metal insulator transition occurs at an interface between the inlet region and the outlet region to remove an electro-static discharge noise signal.

12. The electrical and electronic system of claim 11, wherein the inlet terminal is connected to the power line, the outlet terminal is connected to the ground line, and the control terminal is connected to the power line through a resistor.

13. The electrical and electronic system of claim 12, wherein the 3-terminal switch device is packaged with a passivation film.

14. The electrical and electronic system of claim 12, wherein the 3-terminal switch device is further disposed at front of the electrical and electronic system in series, in parallel or in series parallel.

15. A method of removing an electro-static discharge (EDS) noise signal that can inflow through a power line in an electrical and electronic system having an electrical and electronic circuit, the method comprising:

preparing a metal-insulator transition 3-terminal switch device which
 has an outlet terminal, a control terminal and an inlet terminal, and
 has a first semiconductor region of a first conductivity type configured to function as an outlet region, a second semiconductor region of a second conductivity type configured to function as a control region, and a third semiconductor region of the first conductivity type that is configured to function as an inlet region, and is disposed on the second semiconductor region, such that a discontinuous metal insulator transition occurs at an interface between the inlet region and the outlet region to remove an electro-static discharge noise signal; and connecting the inlet terminal to the power line, connecting the outlet terminal to a ground line of the electrical and electronic circuit and connecting the control terminal to the power line through a resistor.

16. The method of claim 15, wherein a concentration of hole introduced into the control region is $1 \times 10^{18}$ $cm^{-3}$ or more.

17. The method of claim 16, wherein the electrical and electronic system is a home appliance or a portable device.

* * * * *